Feb. 28, 1967 J. B. ROES 3,306,784

EPITAXIALLY BONDED THERMOELECTRIC DEVICE AND METHOD OF FORMING SAME

Filed Aug. 14, 1961

Inventor
John B. Roes
By Soans, Anderson, Luedeka & Fitch
Attys

United States Patent Office 3,306,784

Patented Feb. 28, 1967

3,306,784

EPITAXIALLY BONDED THERMOELECTRIC DEVICE AND METHOD OF FORMING SAME

John B. Roes, San Diego, Calif., assignor to General Dynamics Corporation, New York, N.Y., a corporation of Delaware Filed Aug. 14, 1961, Ser. No. 131,415
6 Claims. (Cl. 136—237)

This application is a continuation-in-part of application Serial No. 57,173, filed September 20, 1960, and now abandoned.

The present invention relates to thermoelectric devices and method of forming the same, and particularly, the invention relates to non-rectifying junctions to thermoelectric semiconductors in such devices and a method of forming the same.

Generally, a thermoelectric device includes a plurality of pairs of p- and n-type semiconductors. In such a pair, one end of a p-type semiconductor (i.e., one which has been doped with an acceptor impurity) is electrically connected to one end of an n-type semiconductor (i.e., one which has been doped with a donor impurity) by a common electrode or conductor. Normally, electrical connections are made to the other end of the semiconductors by separate electrodes or conductors. The junction between each semiconductor and its associated electrode is of the non-rectifying or ohmic (resistive) type. In operation of the thermoelectric device either the common electrode or the separate electrodes are heated thereby providing a hot junction, and the remaining electrode or electrodes are cooled to provide a cold junction.

The application of the semiconductors in thermoelectric devices has been limited because of the difficulty in establishing non-rectifying contact with the semiconductors. The reason for this is that a semiconductor provides a high diffusion rate mechanism for the materials which may be employed to form junctions thereto and which are acceptable mechanically, thermally, and electrically. This alloying or diffusing of the foreign impurties in the semiconductor changes the composition of the semiconductor which generally results in a reduction in the figure of merit of the semiconductor (the figure of merit, which should be as high as possible, is equal to the square of the Seebeck coefficient times the specific electrical conductivity of the semiconductor divided by the thermal conductivity of the semiconductor). In this connection, the Seebeck coefficient and electrical conductivity are reduced and the thermal conductivity of the semiconductor is increased by the foreign impurities. If the concentration of the foreign material in the semiconductor exceeds a certain limit, the thermoelectric power of the semiconductor, and thus the figure of merit, is substantially modified or vanishes completely. Accordingly, a non-rectifying contact to a semiconductor should be made in such a manner that the concentration of foreign impurties is kept at an allowable figure.

Besides controlling the concentration of foreign impurities, the junction is preferably made so that it has a low thermal and electrical resistance, the electrical resistance preferably being negligible compared to the resistance of the semiconductor. Moreover, the junction should have a mechanical strength at least as great as that of the semiconductor. In addition, it is preferable that the junction have a high resistance to thermal shock, that is, the junction should be able to withstand a change of temperature from the lowest to the highest operating temperature of the thermoelectric element without damage.

In certain thermoelectric devices, as for example, solar thermoelectric panels, the thermoelectric elements are extended between and are attached with non-rectifying junctions to a pair of parallel sheets or plates, one of which serves as the cold junction and the other of which serves as the hot junction. The hot junction and the cold junction plates are normally divided into insulated strips whereby the thermoelectric elements are connected in series or parallel circuits.

In previously available thermoelectric devices, the thermoelectric elements have been directly bonded to the plates, the p-type and n-type elements being bonded side by side. Since the p-type element and n-type elements are of different material, complicated fabrication techniques have been required. Also, with previously available fabrication techniques, it has been difficult, and almost impossible to replace individual defective thermoelectric elements.

An object of the present invention is the provision of an improved non-rectifying junction to a thermoelectric semiconductor, and a method of forming the same. Another object is the provision of a non-rectifying junction between a semiconductor and a conductor having one or more of the above mentioned features, and a method of making the same. Still another object is the provision of an improved assembly of thermoelectric elements with hot junction and cold junction sheets. A further object is the provision of an improved method of fabricating a thermoelectric device. Still a further object is the provision of a junction between a thermoelectric semiconductor and a conductor which is durable in use and relatively simple to make.

Other objects and advantages of the present invention will become apparent by reference to the following description and accompanying drawing.

Figure 1:
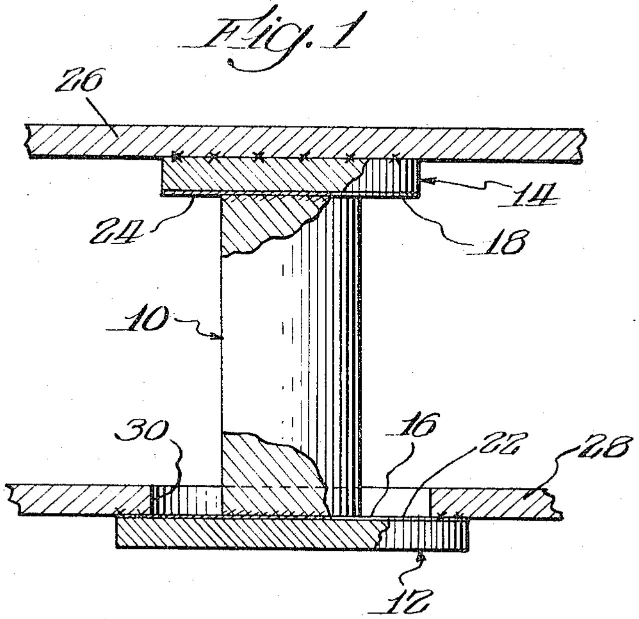
FIGURE 1 is a fragmentary cross-sectional view of a portion of a thermoelectric device showing non-rectifying junctions formed in accordance with the present invention.
Figure 2:
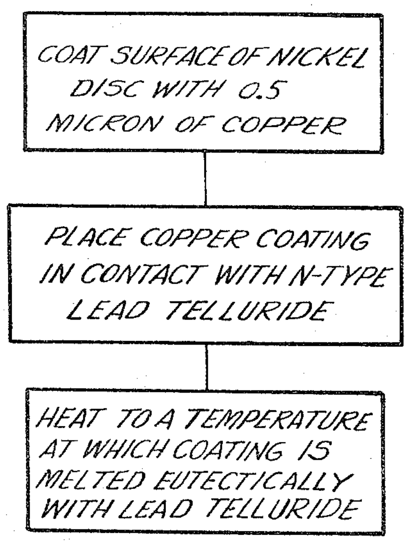
FIGURE 2 is a flow chart of the steps followed in forming one of the junctions shown in FIGURE 1.

Generally, a thermoelectric device, in accordance with the present invention, includes a plurality of thermoelectric semiconductors, one of which is shown in FIGURE 1. The thermoelectric semiconductor has therein one type of doping or impurity. A conductor or electrode, which has a surface that is insoluble in the semiconductor, is connected to one end of the semiconductor through the medium of a layer of doping material. The layer is bonded at one side to the insoluble surface of the conductor and alloyed at its other side with the semiconductor. The layer is of the same type of impurity as that in the semiconductor, and has a lattice constant approximately equal to that of the insoluble surface.

More specifically, the thermoelectric semiconductor, which is indicated in FIGURE 1 by the reference numeral 10, is composed of a semiconductor material which has a high figure of merit, such as lead telluride, bismuth telluride and zinc antimonide. Such a semiconductor 10 contains therein either p-type impurity or n-type impurity to thereby provide respectively a p-type characteristic or n-type characteristic.

In the embodiment illustrated in FIGURE 1, a relatively thin conductor or electrode 12 is connected to one end of the semiconductor 10 and a second conductor or electrode 14 is connected to the other end of the semiconductor 10.

The electrodes 12 and 14 are preferably disc shaped and the second electrode 14 is made smaller in diameter than the first electrode 12 for reasons set forth hereinafter.

Each of the electrodes 12 and 14 is made of a material which does not alloy with or diffuse into the semiconductor 10 at or below the maximum temperature encountered by the thermoelectric device during manufacture or operation. In this way, the semiconductor 10 can be in contact with each of the electrodes 12 or 14 without having a diffusion of the electrode material into the semiconductor.

Also, each of the electrodes 12 and 14, is made of a metal which has about the same coefficient of thermal expansion as that of the semiconductor 10 so as to thereby prevent thermal stress in the semiconductor 10. As an example, the conductors employed with a lead telluride semiconductor may be made of nickel, nickel being insoluble in lead telluride up to about 1100° F., and having approximately the same coefficient of thermal expansion.

Figure 3:
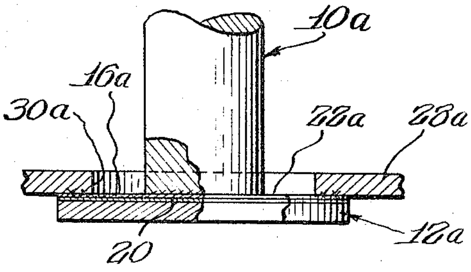
FIGURE 3 is a fragmentary cross-sectional view of a thermoelectric device showing another embodiment of the non-rectifying junction.

In FIGURE 1, the surfaces 16 and 18 of the electrodes 12 and 14 respectively, adjacent the semiconductor 10, are insoluble in the semiconductor 10 because the entire electrode is made of insoluble material. FIGURE 3 shows a non-rectifying junction in accordance with the present invention, wherein a material which is soluble in the semiconductor is employed for the electrode. In FIGURE 3, wherein only one junction is shown and similar parts to those shown in FIGURE 1 are indicated by the same reference numeral with the addition of the subscript "*a*," the insoluble surface 16*a* is provided by applying to the electrode 12*a*, a thin coating or barrier layer 20 of a material which is insoluble in the semiconductor 10*a*, by electroplating, vacuum evaporating, etc. For example, a layer of nickel may be employed to form an insoluble barrier between a lead telluride semiconductor and a copper electrode.

As shown in FIGURE 1, a layer 22 is employed to join the electrode 12 to one end of the semiconductor 10. Similarly, a layer 24 is employed to join the electrode 14 to the other end of the semiconductor 10. Each of the layers 22 and 24, is of a metal which readily alloys with the semiconductor 10 and has a lattice constant approximately equal to that of the electrodes.

Preferably, the lattice constant of the layer 14 is within 5% of the lattice constant of the conductor. Also, the metal, of which each layer 22 and 24 is composed, is selected so that it is of the same type (n-type or p-type) of impurity as that found in the semiconductor 10 (i.e., a material which when added to a semiconductor having a certain type of conductivity is effective to produce the same type of conductivity).

By making the layers 22 and 24, of a metal which has a lattice constant approximately equal to that of the electrodes 12 and 14, each layer is readily bonded by one side to the associated electrode by coating the selected material on the surface of the electrode by a suitable process, such as electroplating, vacuum evaporating, etc. The monomolecular layers of the layer adjacent to the surface of the electrode have properties similar to those of the surface due to epitaxy (i.e., the oriented intergrowth between the monomolecular layers and the surface 13.)

The other side of each of the layers 22 and 24 is alloyed with the semiconductor 10. This alloying is accomplished by placing one end of the semiconductor 10 in contact with the coated side of one of the electrodes 12 and 14 and then suitably heating the coating and the semiconductor 10 to a temperature above the eutectic temperature of the semiconductor 10 and the coating. Preferably, the semiconductor 10 and coating are heated in a reducing atmosphere, so as to prevent the formation of oxide layers. The remaining electrode is similarly joined to the other end of the semiconductor 10.

The maximum temperature to which the semiconductor 10 and the coating are heated preferably is not in excess of the temperature at which the electrode becomes soluble in the semiconductor. At the eutectic temperature the coating diffuses into the semiconductor 10, until the last monomolecular layers of the coating remain. The monomolecular layers do not diffuse into the semiconductor 10 because, by epitaxy, the monomolecular layers have properties similar to the surface of the electrode and therefore are insoluble in the semiconductor 10. As the semiconductor 10 cools, a eutectic composition is formed.

The coating and the semiconductor 10 may be heated by preheating a graphite rod to a temperature above the eutectic temperature of the semiconductor 10 and the coating, but below the temperature at which the electrode diffuses into the semiconductor. The graphite rod is then placed in contact with the uncoated surface of the electrode while the semiconductor 10 and the coating are in a reducing atmosphere of 90% nitrogen and 10% hydrogen. As the graphite rod cools down the electrodes, coating, and the semiconductor 10 are heated and the coating melts eutectically with the semiconductor 10.

As previously indicated, the amount of impurities which diffuses into the semiconductor 10 is limited by the thickness of the coating. The thickness of the coating is made as thin as is consistent with an aceptable junction in the particular application of the thermoelectric device. The coating preferably has a minimum thickness which is greater than a monomolecular layer plus the amount of coating needed to form a eutectic structure with the adjacent surface layer of the semiconductor 10.

The maximum thickness of the coating depends upon the concentration of foreign impurities that is permissible in the semiconductor. The maximum concentration is limited to that which causes the thermoelectric power to vanish. However, the concentration is preferably limited to that which does not substantially affect the thermoelectric properties of the semiconductor. For a given semiconductor material the maximum concentration of foreign impurities varies with different impurity materials, the desired operating range of the semiconductor, and the desired operating characteristics of the semiconductor. With a thermoelectric semiconductor having a relatively high figure of merit, such as lead telluride, the maximum concentration of a foreign impurity, such as copper, preferably is less than about 0.1 percent by volume of the semiconductor. Since the area of the semiconductor and the area of the coating in contact with the semiconductor are the same, the thickness of the coating preferably is made less than 0.1 percent of the length of the semiconductor.

Limiting the thickness of the coating also ensures that once the monomolecular layers are reached, the thermoelectric properties of the semiconductor are not additionally changed during the operation of the thermoelectric device. The resistivity and thermal conductivity of the junction may be made very low and, in fact, may be made lower than that of the semiconductor. Because of the diffusing operation, the resistivity of the thermoelectric element changes gradually from that of the semiconductor to that of the electrode. The mechanical strength of the bond may be made higher than that of the semiconductor.

In a specific embodiment of the invention, a disc shaped electrode of nickel foil, which has a thickness of 1 mil, is joined to an n-type lead telluride semiconductor which is rectangular in shape and has the dimensions of 1 x 1 x 2.5 mm. Lead telluride can be doped with certain foreign impurities to a maximum concentration of about 0.1% without substantially affecting the thermoelectric properties of the lead telluride. The nickel foil is coated with a layer of copper having a thickness of 0.5 micron, and the 1 x 1 mm. side of the semiconductor is pressed against the coating. The semiconductor and the electrode are then heated to a temperature of approximately 600° C. in a reducing atmosphere, and then allowed to cool. Since 600° C. is above the eutectic temperatre of lead telluride and copper, which is about 500° C., the coating is melted eutectically with the semiconductor and diffuses into the semiconductor until the last monomolecular layers are reached.

The resistance of the above described junction is less than 1 percent of the electrical resistance of the semiconductor element. The mechanical strength of the junction is such that the strength of the bond is in excess of the strength of the semiconductor. The thermoelectric properties of the semiconductor do not change over extended periods of operation of the thermoelectric device.

In a second specific embodiment of the invention, a semiconductor of n-type lead telluride having the dimensions of 1 x 1 x 2.5 mm. is joined to a circular electrode foil having a thickness of 1 mil. A barrier layer of 5 microns of nickel is plated on one surface of the copper disc, and a 0.5 micron copper coating is electroplated on the nickel layer. The copper coating is then pressed against the 1 x 1 mm. side of the semiconductor. A graphite rod having a diameter of 3/16 inch is preheated to approximately 800° C. and is then pressed against the other side of the copper sheet. As the graphite cools down, it heats the copper layer and the semiconductor. The copper layer then melts eutectically with the lead telluride.

The junction provided by the above example is 25 microns thick and is composed of 90° lead telluride and 10% copper. This junction may be operated continuously up to a temperature of 500° C. During operation the copper may diffuse further into the semiconductor but, since the amount is limited by the thickness of the copper layer to 0.05% of the lead telluride, there is no substantial effect on the thermoelectric properties of the semiconductor.

In a third illustrative embodiment of p-type semiconductor of zinc antimonide is joined to nickel foil disc having a thickness of 1 mil. A layer of silver, 0.5 micron thick, is employed to join the nickel foil to the semiconductor. A very thin layer of copper, 1/100 of a micron thick is applied to the nickel prior to depositing the silver thereon to prepare the nickel surface to receive the silver layer. The semiconductor is then pressed against the silver layer and the whole is heated to about 600° C. the eutectic temperature of zinc antimonide and silver. The above results in a satisfactory bond between the nickel electrode and the zinc antimonide semiconductor.

By the method described above, a junction is provided between a thermoelectric semiconductor and an electrode, which junction has a low electrical and thermal resistance and which has substantially no effect on the thermoelectric properties of the semiconductor. Moreover, the junction is of a high mechanical strength and when exposed to destructive testing, the semiconductor breaks rather than the junction.

As previously indicated in the illustrated embodiment, the disc electrode 14, which is joined to one end of the thermoelectric element 10 is made smaller in diameter than the other disc electrode 12 which is joined to the other end of the semiconductor. The discs are made of different sizes so that the thermoelectric elements may be easily assembled into a thermoelectric panel which (as shown in FIGURE 1) includes a plate or sheet 26 which is composed of suitable heat absorbing material and serves as a hot junction, and a second plate or sheet 28 of suitable emitting material, which serves as a cold junction.

The composite unit of the thermoelectric semiconductor 10 and the discs 12 and 14 is assembled into the panel by inserting the composite unit into an aperture 30 provided in the cold junction sheet 28 which aperture is slightly larger in diameter than the smaller disc 14. The distance between the cold junction sheet 28 and the hot junction sheet 26 is made such that the end of the composite unit with the smaller disc 14 contacts the inner surface of the hot junction sheet 26 and the inner surface of the larger disc 16 contacts the outer surface of the cold junction sheet 28. The smaller disc 14 is suitably connected to the hot junction sheet 26 and the larger disc 12 is connected to the cold junction sheet 28 by suitable means, such as soldering or brazing.

It should be understood that while the assembly of one semiconductor unit is shown and described, the remaining semiconductors may be likewise assembled in the thermoelectric device. Also the disc electrodes may be other than circular.

By this construction, the conductors or electrodes may be attached to the respective p-type and n-type thermoelectric elements under different conditions without interference. Moreover, it is relatively simple to remove any one of the thermoelectric elements from the thermoelectric panel.

Various changes and modifications may be made in the above described thermoelectric device and method of making the same, without deviating from the spirit or scope of the present invention.

Various features of the invention are set forth in the accompanying claims.

What is claimed is:

1. In a thermoelectric device, an n-type lead telluride semiconductor, an electrode of a material which is insoluble in the semiconductor, and a layer of copper disposed between said electrode and said semiconductor, said copper layer being epitaxially bonded at one side to said electrode and alloyed at the other side with said semiconductor, the amount of said copper alloyed with said semiconductor being less than 0.1 percent by volume of the semiconductor.

2. In a thermoelectric device, an n-type lead telluride semiconductor, an electrode of a material which is soluble in said semiconductor, a layer of nickel bonded to one surface of said electrode, and an additional layer of copper disposed between said semiconductor and said nickel layer, said copper layer being epitaxially bonded at one side to said nickel layer and alloyed at the other side with said semiconductor, the amount of said copper alloyed with said semiconductor being less than 0.1 percent by volume of the semiconductor.

3. In a thermoelectric device, a p-type zinc antimonide semiconductor, an electrode, a layer of copper bonded to one surface of said electrode, and a layer of silver disposed between said copper layer and said semiconductor, said silver layer being epitaxially bonded at one side to said copper layer and alloyed at the other side with said semiconductor, the amount of silver alloyed with said semiconductor being less than 0.1% by volume of said semiconductor.

4. A method of forming a non-rectifying junction between an electrode and an n-type lead telluride semiconductor comprising epitaxially coating a surface of the electrode with copper, said surface being insoluble in the semiconductor, said electrode having a coefficient of thermal expansion approximately that of the semiconductor, contacting said copper coating with the semiconductor, said coating being sufficiently thin so that the amount of doping material between said electrode and said semiconductor is less than 0.1 percent by volume of the semiconductor, and heating said coating together with the semiconductor above the eutectic temperature of said coating and said semiconductor, whereby a low resistance, high strength bond is effected between the semiconductor and the electrode.

5. A method of forming a non-rectifying junction between a copper electrode and a lead telluride semiconductor, comprising applying a coating of nickel to a surface of the electrode, epitaxially coating said nickel coating with copper, contacting said copper coating with the semiconductor, said copper coating being of a thickness such that the amount of doping material between said electrode and the semiconductor is less than 0.1 percent by volume of the semiconductor, and heating said copper coating together with the semiconductor above the eutectic temperature of said copper coating and said semiconductor, whereby a low resistance, high strength bond is effected between the semiconductor and the electrode.

6. A method of forming a non-rectifying junction between a nickel electrode and a p-type zinc antimonide semiconductor, comprising applying a $\frac{1}{100}$ micron coating of copper to a surface of the electrode, applying an epitaxial .5 micron coating of silver to said copper coating, contacting said silver coating with the semiconductor and heating said silver coating together with the semiconductor above the eutectic temperature of said silver coating and said semiconductor, whereby a low resistance, high strength bond is effected between the semiconductor and the electrode.

References Cited by the Examiner

UNITED STATES PATENTS

| | | | |
|---|---|---|---|
| 2,373,117 | 4/1945 | Hobrock | 29—504 X |
| 2,555,001 | 5/1951 | Ohl | 29—504 X |
| 2,701,326 | 2/1955 | Pfann et al. | 29—504 X |
| 2,811,569 | 10/1957 | Fredrick et al. | 136—5 |
| 2,854,612 | 9/1958 | Zaratkiewicz | 29—470 X |
| 2,997,514 | 8/1961 | Roeder | 136—4.2 |
| 3,000,092 | 9/1961 | Scuro | 136—5 X |
| 3,037,064 | 5/1962 | Rosi et al. | 136—5 |
| 3,037,065 | 5/1962 | Hockings et al. | 136—5 |

OTHER REFERENCES

Abeles et al.: "Thermoelectric Materials for Power Conversion," in "A.S.T.I.A. Report A.D. 241,247," August 10, 1959, page 35.

WINSTON A. DOUGLAS, *Primary Examiner.*

JOHN H. MACK, ALLEN B. CURTIS, J. BARNEY, A. M. BEKELMAN, *Assistant Examiners.*